US007923321B2

(12) United States Patent
Lai et al.

(10) Patent No.: US 7,923,321 B2
(45) Date of Patent: Apr. 12, 2011

(54) METHOD FOR GAP FILLING IN A GATE LAST PROCESS (75) Inventors: Su-Chen Lai, Hsinchu (TW); Kong-Beng Thei, Hsin-Chu Country (TW); Harry Chuang, Hsin-Chu (TW); Gary Shen, Yonghe (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 36 days.

(21) Appl. No.: 12/487,894

(22) Filed: Jun. 19, 2009

(65) Prior Publication Data
US 2010/0112798 A1 May 6, 2010

Related U.S. Application Data (60) Provisional application No. 61/110,831, filed on Nov. 3, 2008.

(51) Int. Cl.
*H01L 21/8238* (2006.01)
(52) U.S. Cl. ........ 438/230; 438/231; 438/275; 438/591; 438/595; 257/E21.434; 257/E21.444
(58) Field of Classification Search .................. 438/230, 438/231, 275, 591, 595, FOR. 193; 257/E21.434, 257/E21.444
See application file for complete search history.

(56) References Cited

U.S. PATENT DOCUMENTS

| | | | | |
|---|---|---|---|---|
| 6,774,048 | B2 * | 8/2004 | Baek et al. | 438/758 |
| 7,763,532 | B2 * | 7/2010 | Frohberg et al. | 438/592 |
| 2008/0185637 | A1 * | 8/2008 | Nagaoka et al. | 257/327 |
| 2009/0014812 | A1 * | 1/2009 | Wang et al. | 257/392 |
| 2010/0052074 | A1 * | 3/2010 | Lin et al. | 257/407 |
| 2010/0059833 | A1 * | 3/2010 | Yu et al. | 257/410 |
| 2010/0065926 | A1 * | 3/2010 | Yeh et al. | 257/410 |
| 2010/0087055 | A1 * | 4/2010 | Lai et al. | 438/585 |

* cited by examiner

*Primary Examiner* — George Fourson
(74) *Attorney, Agent, or Firm* — Haynes and Boone, LLP (57) ABSTRACT

A method is provided for fabricating a semiconductor device that includes providing a semiconductor substrate having a first region and a second region, forming a high-k dielectric layer over the substrate, forming a silicon layer over the high-k dielectric layer, forming a hard mask layer over the silicon layer, patterning the hard mask layer, silicon layer, and high-k dielectric layer to form first and second gate structures over the first and second regions, respectively, forming a contact etch stop layer (CESL) over the first and second gate structures, modifying a profile of the CESL by an etching process, forming an inter-layer dielectric (ILD) over the modified CESL, performing a chemical mechanical polishing (CMP) on the ILD to expose the silicon layer of the first and second gate structures, respectively, and removing the silicon layer from the first and second gate structures, respectively, and replacing it with metal gate structures.

20 Claims, 9 Drawing Sheets

METHOD FOR GAP FILLING IN A GATE LAST PROCESS

PRIORITY DATA

This application claims priority to Provisional Application Ser. No. 61/110,831 filed on Nov. 3, 2008, entitled "METHOD FOR GAP FILLING IN A GATE LAST PROCESS," the entire disclosure of which is hereby incorporated by reference.

BACKGROUND

The present disclosure relates generally an integrated circuit device and, more particularly, to method for gap filling in a gate last process.

As technology nodes shrink, in some IC designs, there has been a desire to replace the typically polysilicon gate electrode with a metal gate electrode to improve device performance with the decreased feature sizes. Providing metal gate structures (e.g., including a metal gate electrode rather than polysilicon) offers one solution. One process of forming a metal gate stack is termed "gate last" process in which the final gate stack is fabricated "last" which allows for reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high dielectric constant (high-k) gate insulator layers are also used which allow greater physical thicknesses while maintaining the same effective thickness as would be provided by a typical gate oxide used in larger technology nodes.

There are challenges to implement such features and processes in CMOS fabrication however. As the gate length and spacing between devices decrease, these problems are exacerbated. For example, in a "gate last" fabrication process, voids may be generated during deposition of an inter-layer dielectric (ILD) for gap filling. Also, controlling the gate height during a chemical mechanical polishing (CMP) on the ILD is difficult. Therefore, what is needed is a new and improved device and method of gate formation.

SUMMARY

One of the broader forms of an embodiment of the invention involves a method of fabricating a semiconductor device. The method includes providing a semiconductor substrate, forming one or more gate structures over the semiconductor substrate, forming an etch stop layer over the semiconductor substrate, including over the one or more gate structures, modifying a profile of the etch stop layer, forming a dielectric layer over the modified etch stop layer; and performing a chemical mechanical polishing process on the dielectric layer until a top portion of the one or more gate structures is reached.

Another one of the broader forms of an embodiment of the invention involves a method of fabricating a semiconductor device. The method includes providing a semiconductor substrate having a first region and a second region, forming a high-k dielectric layer over the semiconductor substrate, forming a silicon layer over the high-k dielectric layer, forming a hard mask layer over the silicon layer, patterning the hard mask layer, the silicon layer, and the high-k dielectric layer to form a first gate structure over the first region and a second gate structure over the second region, forming a contact etch stop layer (CESL) over the first and second gate structures, modifying a profile of the CESL, forming an interlayer dielectric (ILD) over the modified CESL, performing a chemical mechanical polishing (CMP) on the ILD to expose the silicon layer of the first and second gate structures, respectively, and removing the silicon layer from the first and second gate structures, respectively, and replacing it with metal gate structures.

Yet another one of the broader forms of an embodiment of the invention involves a method of fabricating a semiconductor device. The method includes providing a semiconductor substrate having a first region and a second region, forming a first gate structure over the first region and a second gate structure over the second region, the first and second gate structures each including a high-k dielectric layer, a dummy poly gate, and a hard mask, forming a contact etch stop layer (CESL) over the first and second gate structures including the hard masks of the first and second gate structures, respectively, modifying a profile of the CESL such that a gap measured between the first and second gate structures becomes larger, forming an interlayer dielectric (ILD) over the modified CESL substantially filling in the gap, performing a chemical mechanical polishing (CMP) on the ILD layer to remove the hard masks from the first and second gate structures, respectively, and expose the dummy poly gates of the first and second structures, respectively, and removing the dummy poly gates from the first and second gate structures, respectively, and replacing them with metal gate structures.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to forming an integrated circuit device on a substrate and, more particularly, to fabricating a gate structure as part of an integrated circuit (including FET devices). It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however one skilled in the art may recognize applicability to other processes and/or use of other materials.

Figure 1:
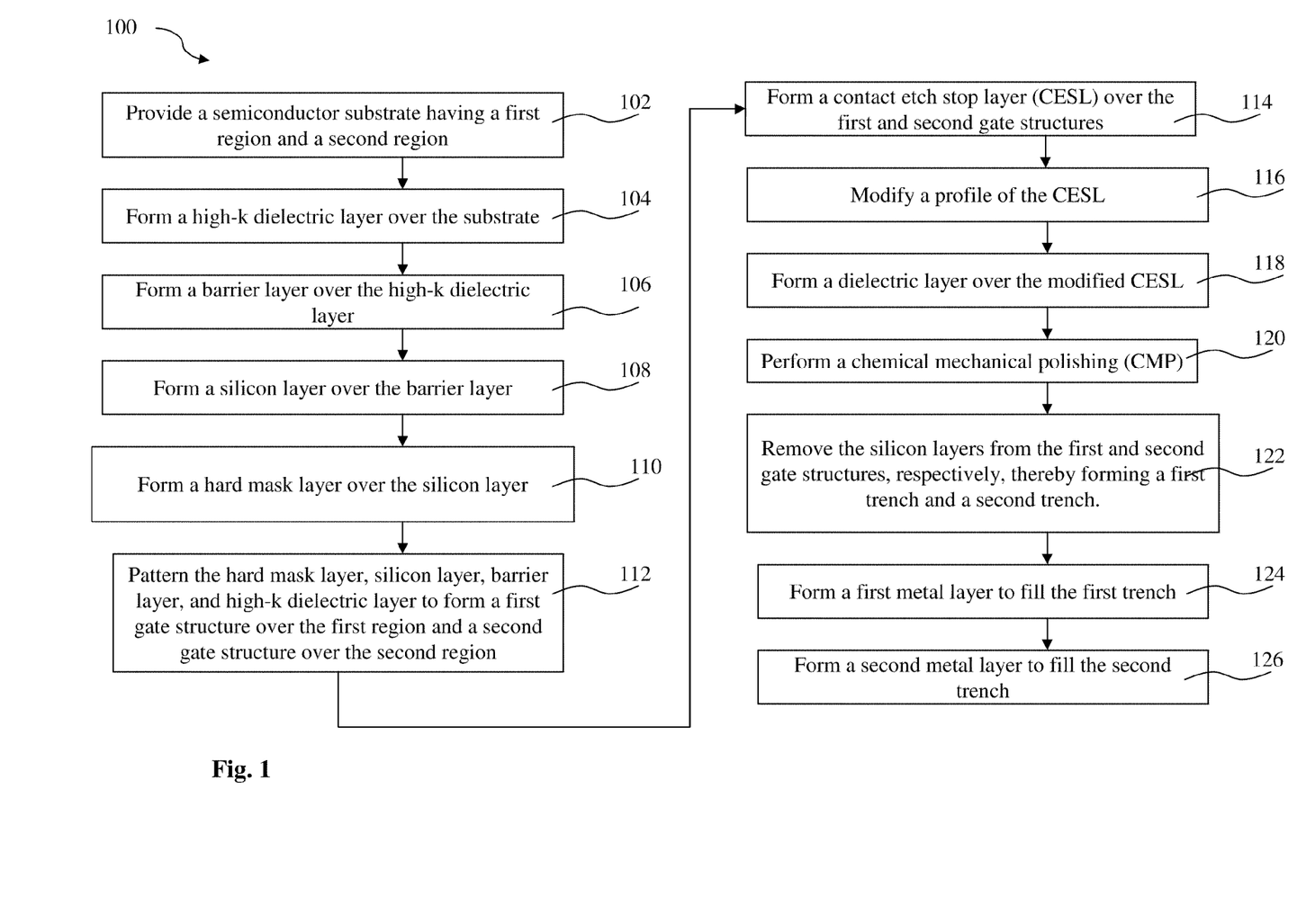
FIG. 1 is a flowchart of a method for fabricating a semiconductor device in a gate last process according to various aspects of the present disclosure.

Referring to FIG. 1, illustrated is a flowchart of a method 100 for fabricating a semiconductor device in a "gate last" process. Referring also to FIGS. 2A to 2H illustrated are cross-sectional views of a semiconductor device 200 at various stages of fabrication in a gate last process according to the method 100 of FIG. 1. The semiconductor device 200 may be an integrated circuit, or portion thereof, that may comprise static random access memory (SRAM) and/or logic circuits, passive components such as resistors, capacitors, and inductors, and active components such as P-channel field effect transistors (pFET), N-channel FET (nFET), metal-oxide semiconductor field effect transistors (MOSFET), or complementary metal-oxide semiconductor (CMOS) transistors.

Figure 2A:
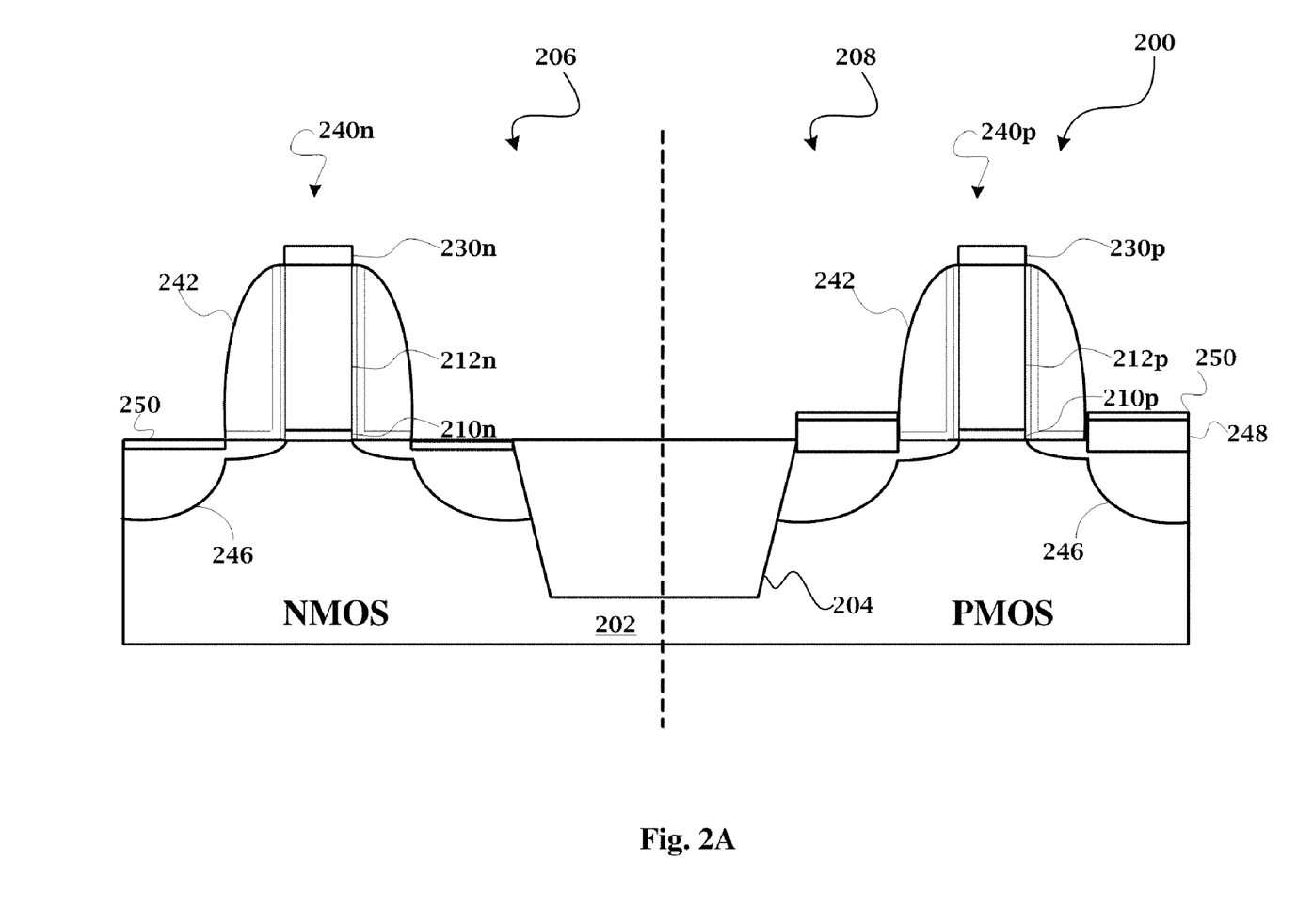
FIGS. 2A to 2H are cross-sectional views of a semiconductor device at various stages of fabrication according to the method of FIG. 1.

It should be noted that some features of the semiconductor device 200 may be fabricated with a CMOS process flow. Accordingly, it is understood that additional processes may be provided before, during, and after the method 100 of FIG. 1, and that some other processes may only be briefly described herein. For example, the semiconductor 200 is illustrated in FIG. 2A following a salicide (or self-aligned silicide) process that forms silicide or contact features on various doped regions such as the source and drain region.

The method 100 begins with block 102 in which a semiconductor substrate is provided, the substrate having a first region and a second region. In FIG. 2A, the semiconductor device 200 includes a substrate 202. In the present embodiment, the substrate 202 includes a silicon substrate (e.g., wafer) in crystalline structure. The substrate 202 may include various doping configurations depending on design requirements as is known in the art (e.g., p-type substrate or n-type substrate) Additionally, the substrate 202 may include various doped regions such as p-type wells (p-wells) or n-type wells (n-wells). Other examples of the substrate 202 may also include other elementary semiconductors such as germanium and diamond. Alternatively, the substrate 202 may include a compound semiconductor such as, silicon carbide, gallium arsenide, indium arsenide, or indium phosphide. Further, the substrate 202 may optionally include an epitaxial layer (epi layer), may be strained for performance enhancement, and/or may include a silicon-on-insulator (SOI) structure.

The semiconductor device 200 includes isolation structures such as shallow trench isolation (STI) features 204 formed in the substrate 202 to isolate one or more devices from each other. In the present embodiment, the STI feature 204 may isolate an nMOS device 206 and a pMOS device 208. The STI features 204 may include silicon oxide, silicon nitride, silicon oxynitride, fluoride-doped silicate glass (FSG), and/or a low k dielectric material. Other isolation methods and/or features are possible in lieu of or in addition to STI. The STI features 204 may be formed using processes such as reactive ion etch (RIE) of the substrate 202 to form trenches which are then filled with an insulator material using deposition processes followed by a CMP process.

The method 100 continues with block 104 in a high-k dielectric layer is formed over the semiconductor substrate. The semiconductor device 200 includes a gate dielectric 210 formed over the substrate. The gate dielectric 210 includes an interfacial layer. The interfacial layer may include a silicon oxide layer (e.g., thermal oxide or chemical oxide) having a thickness ranging from about 5 to about 10 angstrom (A). The gate dielectric 210 further includes a high dielectric constant (high-k) material layer formed on the interfacial layer. In an embodiment, the high-k dielectric material includes hafnium oxide ($HfO_2$). Other examples of high-k dielectrics include hafnium silicon oxide (HfSiO), hafnium silicon oxynitride (HfSiON), hafnium tantalum oxide (HfTaO), hafnium tantalum oxynitride (HfTaON), hafnium titanium oxide (HfTiO), hafnium titanium oxynitride (HfTiON), hafnium zirconium oxide (HfZrO), hafnium zirconium oxynitride (HfZrON), combinations thereof, and/or other suitable materials. The high-k dielectric layer may be formed by atomic layer deposition (ALD), chemical vapor deposition (CVD), or other suitable technique. The high-k dielectric layer may include a thickness ranging from about 10 to about 30 angstrom (A).

The method 100 continues with block 106 in which a barrier layer is formed over the high-k dielectric layer. In some embodiments, a barrier layer may optionally be formed over the high-k dielectric layer. The barrier layer may include TiN or TaN having a thickness ranging from abut 10 to about 50 angstrom (A). The barrier layer may be formed by various deposition techniques such as ALD, CVD, physical vapor deposition (PVD), or other suitable process.

The method 100 continues with block 108 in which a silicon layer is formed over the barrier layer. The semiconductor device 200 further includes a polysilicon (or poly) layer 212 formed over the barrier layer by CVD or other suitable deposition process. For example, silane ($SiH_4$) may be used as a chemical gas in the CVD process to form the poly layer 212. The poly layer 212 may include a thickness ranging from about 400 to about 800 angstrom (A). The semiconductor layer may alternatively include an amorphous silicon layer instead of a polysilicon layer.

The method 100 continues with block 110 in which a hard mask layer is formed over the silicon layer. A hard mask layer 230 is formed over the poly layer 212. The hard mask layer 230 may include silicon oxide. The hard mask layer 230 may include a thickness ranging from about 100 to about 400 angstrom (A). Alternatively, the hard mask layer 230 may optionally include silicon oxynitride, and/or other suitable materials. The hard mask layer 230 may be formed using methods such as CVD, PVD, or ALD. Additionally, an anti-reflective coating (ARC) layer or bottom anti-reflective coating (BARC) layer may be formed on the hard mask layer 230 to enhance a subsequent patterning process as is known in the art. A patterned photoresist layer may be formed on the hard mask layer 230. The patterned photoresist layer may include a gate pattern for the nMOS device 206 and a gate pattern for the pMOS device 208. The gate patterns may be formed by photolithography, immersion lithography, ion-beam writing, or other suitable process.

The method 100 continues with block 112 in which the hard mask layer, silicon layer, barrier layer, and high-k dielectric layer are patterned to form a first gate structure over the first region and a second gate structure over the second region. The hard mask layer 230 may be patterned by a dry or wet etching process using the patterned photoresist as a mask, and the patterned hard mask layer may be used to pattern a gate structure 240*n* of the nMOS device 206 and a gate structure 240*p* of the pMOS device 208. The gate structures 240*n*, 240*p* may be formed by a dry etching or wet etching or combination dry and wet etching process (e.g., gate etching or patterning). For example, the dry etching process may use a fluorine-containing plasma (e.g., etch gas includes $CF_4$). Alternatively, the etching process may include multiple etching steps to etch the various gate material layers. The patterned photoresist layer may be removed by a stripping or ashing process.

The gate structure 240*n* of the nMOS device 206 includes a hard mask layer 230*n*, a dummy poly gate 212*n*, a barrier layer (if provided), and a gate dielectric layer 210*n* (including an interfacial layer and high-k dielectric layer). The gate structure 240*p* of the pMOS device 208 includes a hard mask layer 230*p*, a dummy poly gate 212*p*, a barrier layer (if provided), and a gate dielectric layer 210*p* (including an interfacial layer and high-k dielectric layer).

It is understood that the semiconductor device 200 may undergo further processing in a CMOS process flow to form various features as is known in the art. For example, gate or sidewall spacers 242 are formed on sidewalls of the gate structures 240n, 240p. The spacers 242 may include a multi-layer configuration. In the present embodiment, the spacers 242 may be formed of silicon nitride. Alternatively, the spacers 242 may be formed of silicon oxide, silicon oxynitride, silicon carbide, fluoride-doped silicate glass (FSG), a low-k dielectric material, combinations thereof, and/or other suitable material. The spacers 242 may be formed by methods including deposition of suitable dielectric material and anisotropically etching the material to form the spacer 242 profile. A liner layer may be formed on the sidewalls of the gate structures 240p, 240n prior to forming the spacers 242. The liner layer may include a dielectric material such as silicon oxide, silicon nitride, and/or other suitable materials.

Also, source/drain (S/D) regions 246 are formed in the substrate 202. The S/D regions 246 may include lightly doped source/drain regions (LDD) and heavy doped source/drain regions. It should be noted that the LDD regions may be formed prior to formation of the spacers 242. The S/D regions 246 may be formed by implanting p-type or n-type dopants or impurities into the substrate 202 depending on the desired transistor configuration (e.g., pMOS or nMOS). The S/D regions 246 may be formed by methods including photolithography, ion implantation, diffusion, and/or other suitable processes. An annealing process is performed thereafter to activate the S/D regions 246. The annealing process can be implemented by a suitable method, such as rapid thermal annealing (RTA) or laser annealing. Further, the S/D regions 246 of the pMOS device 208 may include raised S/D regions with SiGe features 248. For example, the SiGe features 248 may be formed by an epitaxy process such that the SiGe features can be formed in a crystalline state in the substrate 202. Thus, a strained channel may be achieved in the pMOS device 208 to increase carrier mobility and enhance device performance.

Further, contact features 250 such as silicide may be formed and coupled to the S/D regions 246. The contact features 250 may be formed on the S/D regions 246 and SiGe features 248 by a salicide (self-aligned silicide) process. For example, a metal material may formed next to silicon structures, then the temperature is raised to anneal and cause a reaction between the underlying silicon and metal material to form silicide, and the un-reacted metal may be etched away. The contacts 250 may include nickel silicide, cobalt silicide, tungsten silicide, tantalum silicide, titanium silicide, platinum silicide, erbium silicide, palladium silicide, or combinations thereof. It should be noted that the hard mask layers 230n, 230p may protect the dummy poly layers 212n, 212p, respectively, from the salicide process. It should be noted that following the salicide process, the hard mask layers 230n, 230p of the gate structures 240n, 240p, respectively, are not removed to provide for better metal gate height control in a "gate last" process as will be discussed below.

Figure 2B:
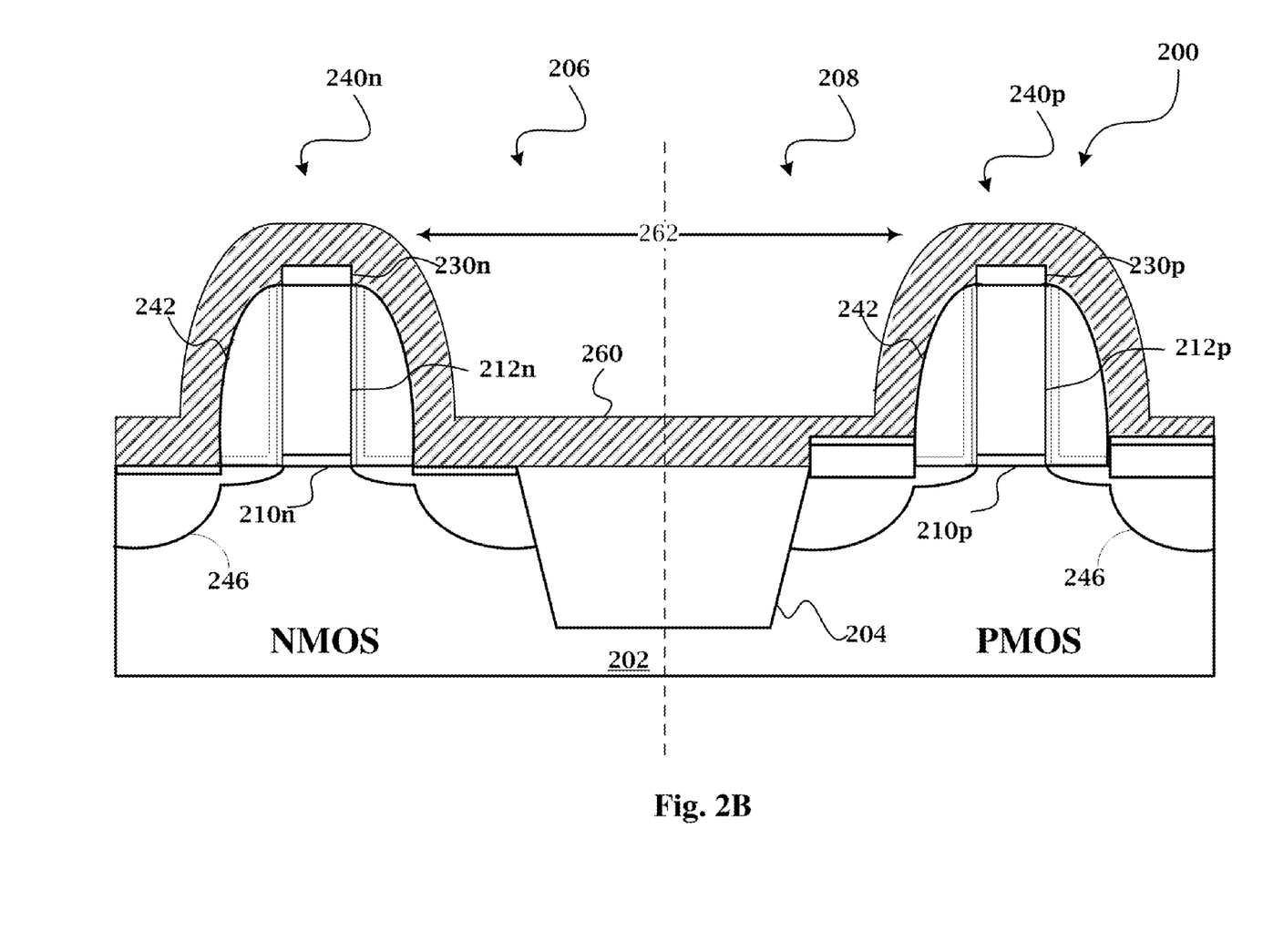

The method 100 continues with block 114 in which a contact etch stop layer (CESL) is formed over the first and second gate structures. In FIG. 2B, an etch stop layer such as a contact etch stop layer (CESL) 260 may be formed over the gate structures 240n, 240p including the hard mask layers 230n, 230p. In the present embodiment, the CESL 260 may be formed of silicon nitride. Alternatively, the CESL 260 may optionally be formed of silicon oxynitride, and/or other suitable materials. The CESL 260 may include a thickness ranging from 100 to about 1000 angstrom (A). The CESL 260 composition may be selected based upon etching selectivity to one or more additional features of the semiconductor device 200. Further, the CESL 260 may be configured as a tensile-CESL or a compressive-CESL depending on the transistor type. The CESL 260 may be formed by plasma enhanced CVD, low pressure CVD, ALD, or other suitable processes.

It has been observed that following the deposition of the CESL 260, there may be some overhang of the CESL material at a region 262 between the nMOS and pMOS devices 206, 208. As such, the overhang at the region 262 may make it more difficult and challenging to subsequently fill in the gap with a dielectric material. It has been observed that in some circumstances a void may be formed within the gap between adjacent devices 206, 208. Thus, the void may adversely affect subsequent processing and may also lead to poor device performance. This will be exacerbated as the trend of incorporating more devices on a single chip continues and the spacing between adjacent devices becomes smaller.

Figure 2C:
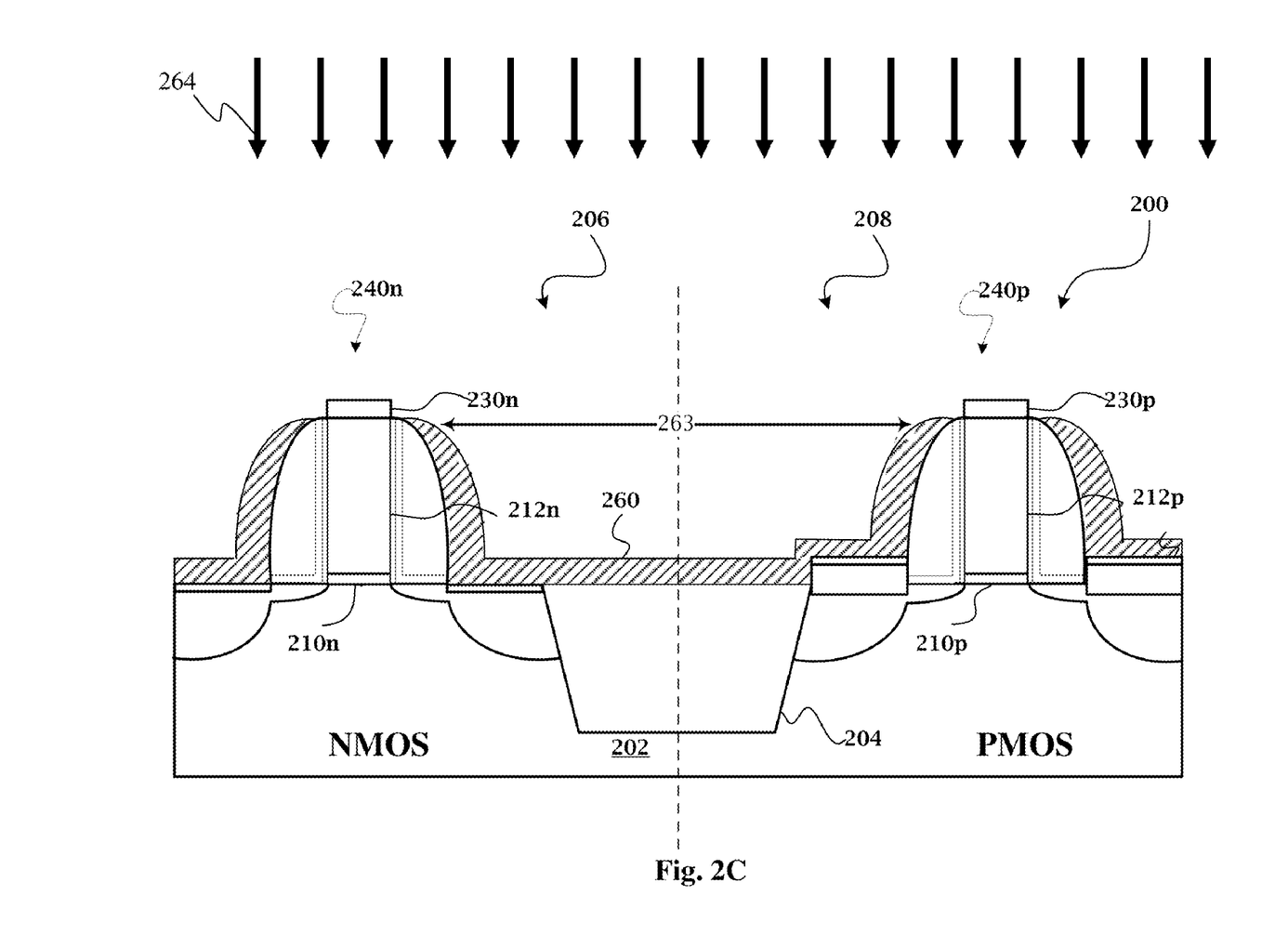

The method 100 continues with block 116 in which a profile of the CESL is modified. In FIG. 2C, the CESL 260 may be modified by an etching process that shapes the CESL 260 with a sloped profile 263. In other words, the gap between the nMOS device 206 and pMOS device 208 may be widened by modifying the profile of the CESL 260. In the present embodiment, a dry etching process 264 may implemented to anisotropically etch the CESL 260 to modify the profile 263 of the CESL. The dry etching process (e.g., plasma etching) 264 may use an etch gas that includes $NH_3$, $NF_3$, He or Ar, and HF. The dry etching process 264 may selectively etch the silicon nitride material of the CESL 260. However, it should be noted that a portion of the hard mask layers 230n, 230p may be removed during the dry etching process.

Generally, high density plasma CVD (HDP-CVD) processes may provide a high density of low energy ions resulting in higher quality films at lower deposition temperatures. During HDP-CVD processes, sputtering and deposition may take place simultaneously, resulting in a deposition/sputtering ratio that may be adjusted according to desired processing parameters. The HDP-CVD processes may comprise varying deposition/sputtering ratios. In some embodiments, the HDP-CVD process may comprise a high sputtering HDP-CVD process, which comprises a low deposition/sputtering ratio. The low deposition/sputtering ratio may be selected between about 2 to about 4. In some embodiments, the HDP-CVD process may comprise a low sputtering HDP-CVD process, which comprises a high deposition/sputtering ratio. The high deposition/sputtering ratio may be selected between about 5 to about 7. It is understood that several parameters may be adjusted to alter the sputtering rate and/or deposition/sputtering ratio, including biasing power, pressure, flow rate, deposition temperature, wafer temperature, RF power, other suitable parameters, and/or combinations thereof. Further, the HDP-CVD processes utilize any suitable gas to form layers to fill the gaps. For example, silane ($SiH_4$), oxygen ($O_2$), argon (Ar), other suitable gases, and/or combinations thereof may be used to form a dielectric layer within the gaps.

Alternatively, the profile of the CESL 260 may optionally be modified by a HDP-CVD process. In the present embodiment, the profile of the CESL 260 is modified from the first profile, having the overhang within the gap/region 262 (FIG. 2B) to a second profile 263 (FIG. 2C), having a sloped profile with a widened gap/region. In other words, the gap between the NMOS device region 206 and the PMOS device region 208 may be widened by modifying the profile of the CESL 260. The HDP-CVD process is set to selectively etch the silicon nitride material of the CESL 260, modifying the profile to have a sloped profile 263 along the gate structures 240n, 240p. It should be noted that the HDP-CVD process to modify the profile comprises a high sputtering HDP-CVD process. In some embodiments, the HDP-CVD process may form a thin layer of a dielectric layer over the CESL 260. It is understood that a portion of the hard mask layer 230n, 230p may be removed during the HDP-CVD process.

Figure 2D:
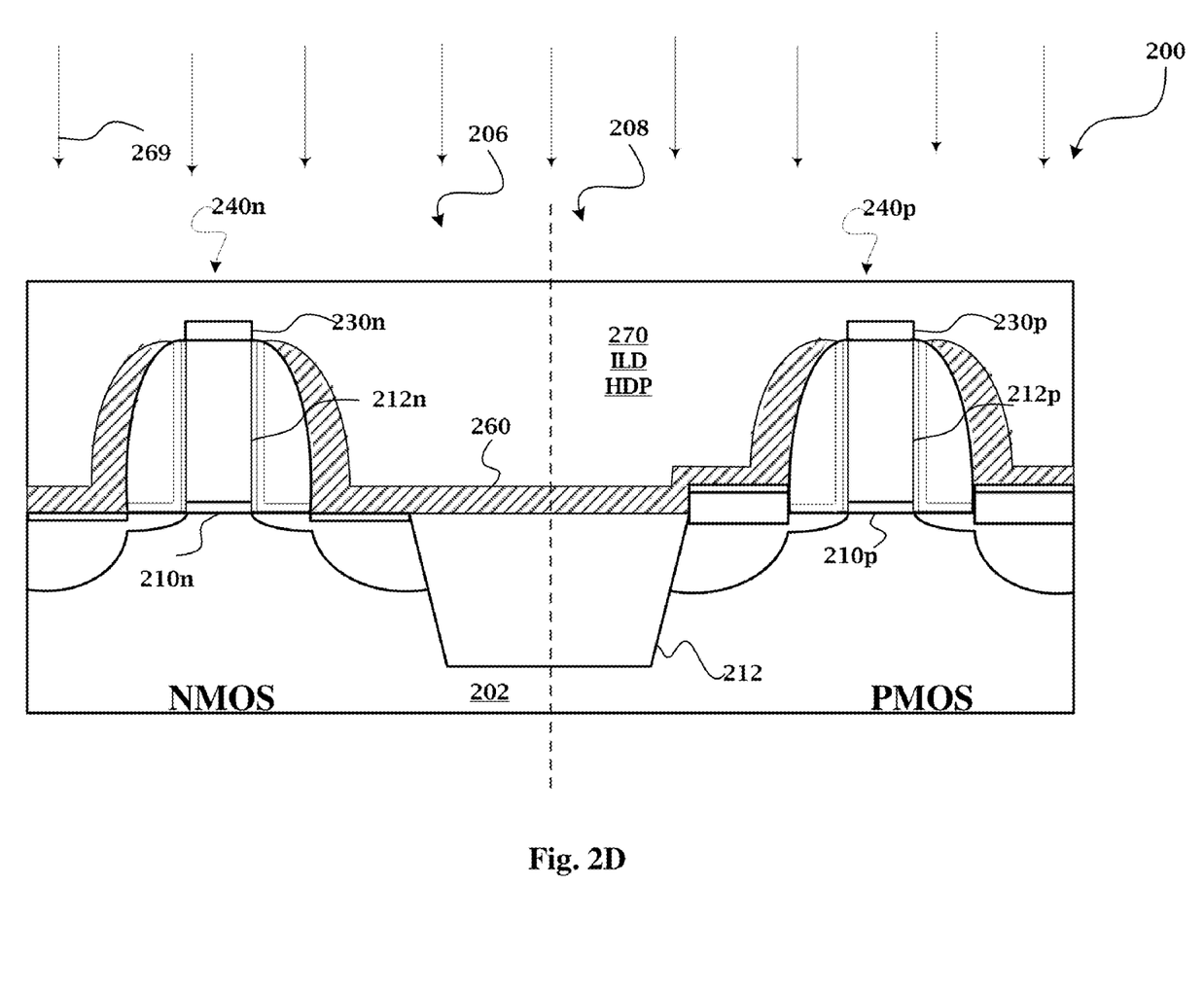

The method 100 continues with block 118 in which an dielectric layer is formed over the modified CESL. In FIG. 2D, a dielectric layer 270 such as an inter-layer (or level) dielectric (ILD) layer may be formed overlying the gate structures 240p, 240n including the modified CESL 260. The dielectric layer 270 substantially fills in the gap between adjacent devices 206 and 208, and thus the gap may be substantially void free. The dielectric layer 270 may be formed by a HDP-CVD, spin-on, sputtering, or other suitable methods. In an embodiment, the dielectric layer 270 includes a HDP dielectric material (e.g., HDP oxide). The HDP-CVD process 269 includes a low sputtering HDP-CVD process. Alternatively, the dielectric layer 270 may optionally include a spin-on-glass (SOG) or high aspect ration process (HARP) dielectric material. Further, the dielectric layer 270 may comprise a dielectric material, such as silicon oxide, silicon nitride, silicon oxynitride, spin-on glass (SOG), fluorinated silica glass (FSG), carbon doped silicon oxide (e.g., SiCOH), Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, other proper porous polymeric materials, other suitable dielectric materials, and/or combinations thereof.

Figure 2E:
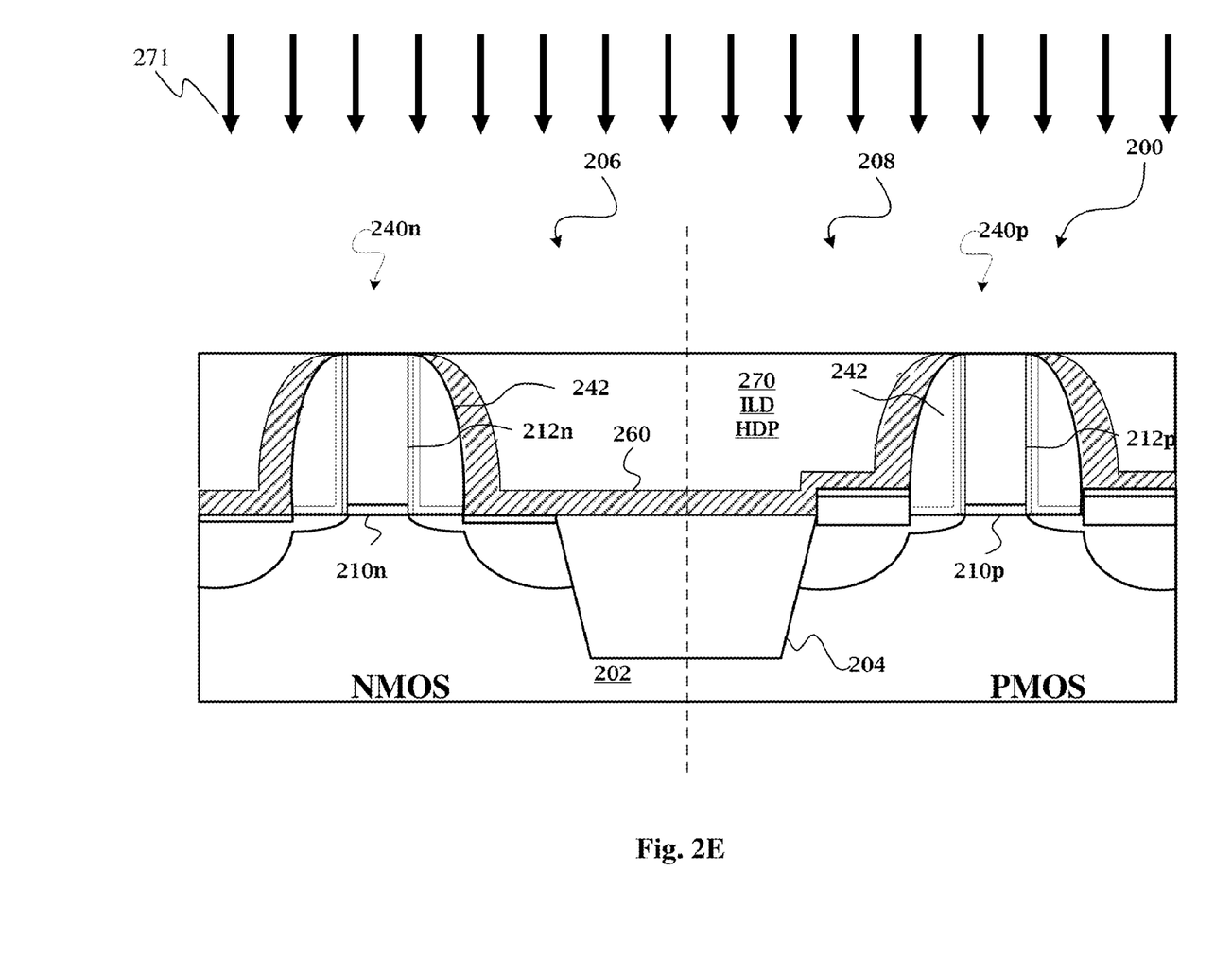

The method 100 continues with block 120 in which a chemical mechanical polishing (CMP) is performed on the ILD. In FIG. 2E, in a gate last process, the dummy poly gates 212p, 212n may be removed so that metal gate structures may be formed to replace of the dummy poly gates. Accordingly, the dielectric layer 270 is planarized by a chemical mechanical polishing (CMP) process 271 until a top portion of the dummy poly gates 212n, 212p of the nMOS 206 device and pMOS device 208, respectively, are reached or exposed. For example, the CMP process 271 may polish the dielectric layer 270 and hard mask layers 230n, 230p (both formed of oxide), and may stop at the silicon nitride film. It should be noted that it may be easier to control the height of the gate structures 240n, 240p for the CMP process 271. As previously noted, the hard mask layers 230n, 230p were not removed for the ILD gap fill. Accordingly, there is no loss issue with respect to the silicon nitride film on the sidewalls of the gate structure 240p in the pMOS device side 208. That is, the hard mask removal process would have removed a portion of the silicon nitride film in one device side due to the different thicknesses of the hard mask layers. Since the hard mask removal process was not performed for the ILD gap fill, the CMP process 271 may expose both dummy poly gates 212n, 212p without overpolishing and decreasing the gate height of one of the devices.

Figure 2F:
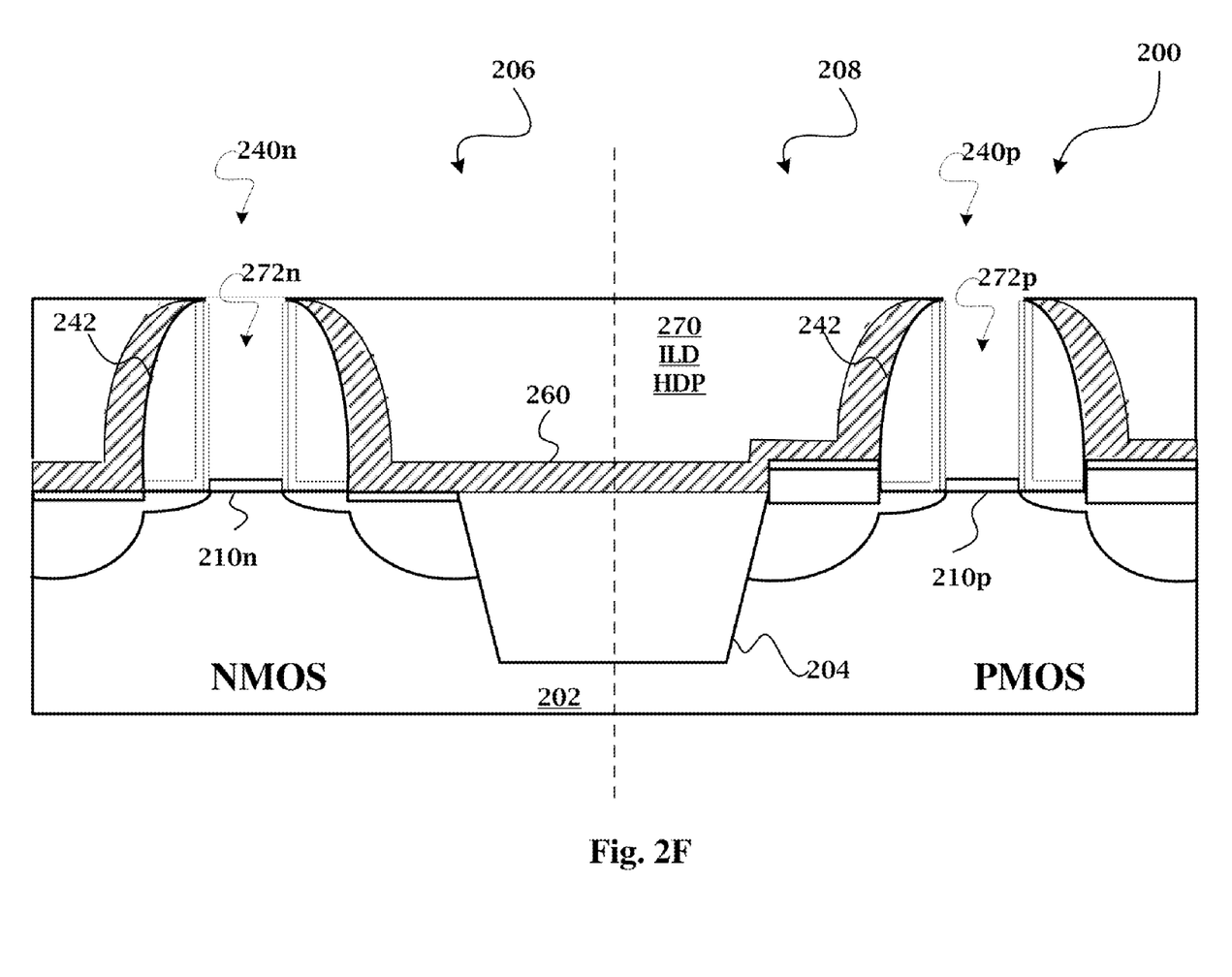

The method 100 continues with block 122 in which the semiconductor layers are removed from the first and second gate structures, respectively, thereby forming a first trench and a second trench. In FIG. 2F, following the CMP process 271, the dummy poly gates 212n, 212p of the gate structures 240n, 240p are removed. For example, polysilicon is selectively etched removing the dummy poly gates 212n, 212p. The selective removal of the dummy poly gates 212n, 212p provides trenches 272n, 272p, respectively, within which metal gates may be formed. The dummy poly gates 212n, 212p may be removed using a wet etch and/or a dry etch. In an embodiment, a wet etch process includes exposure to a hydroxide containing solution (e.g., ammonium hydroxide), deionized water, and/or other suitable etchant solutions.

Figure 2G:
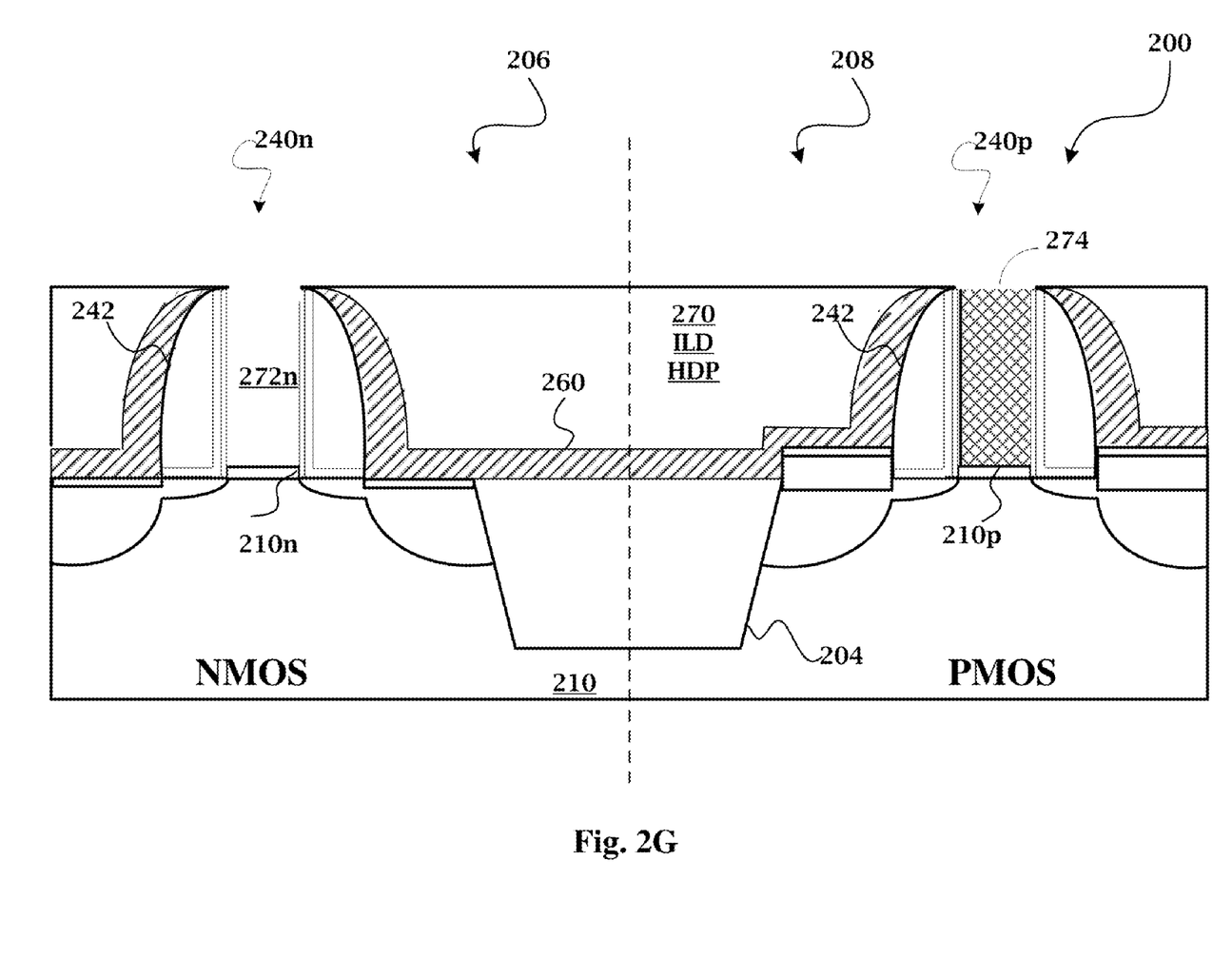

The method 100 continues with block 124 in which a first metal layer is formed to substantially fill the first trench. In FIG. 2G, a metal layer 274 is deposited to fill in the trench 272p. The metal layer 274 may include any metal material suitable for forming a metal gate or portion thereof, including work function layers, liner layers, interface layers, seed layers, adhesion layers, barrier layers, etc. The metal layer 274 may be formed by PVD, CVD, or other suitable processes. The metal layer 274 may include a P-type work function metal (P-metal) to provide a gate electrode that properly performs in the pMOS device 208. P-metal materials include TiN, WN, TaN, conductive metal oxides, and/or other suitable materials. The metal layer 274 may further include a fill metal layer formed on the work function metal layer. The fill metal layer may include aluminum (Al) or tungsten (W), or other suitable materials. In an embodiment, the fill metal may include a Ti layer that functions as a wetting layer and an Al layer to fill in the remainder of the trench. The fill metal layer may be deposited using CVD, PVD, plating, or other suitable process. A CMP process may be performed to planarize the semiconductor device 200. The CMP process may remove the metal layer 274 outside of the trench 272p and provides the semiconductor device 200 with a P-metal gate structure.

Figure 2H:
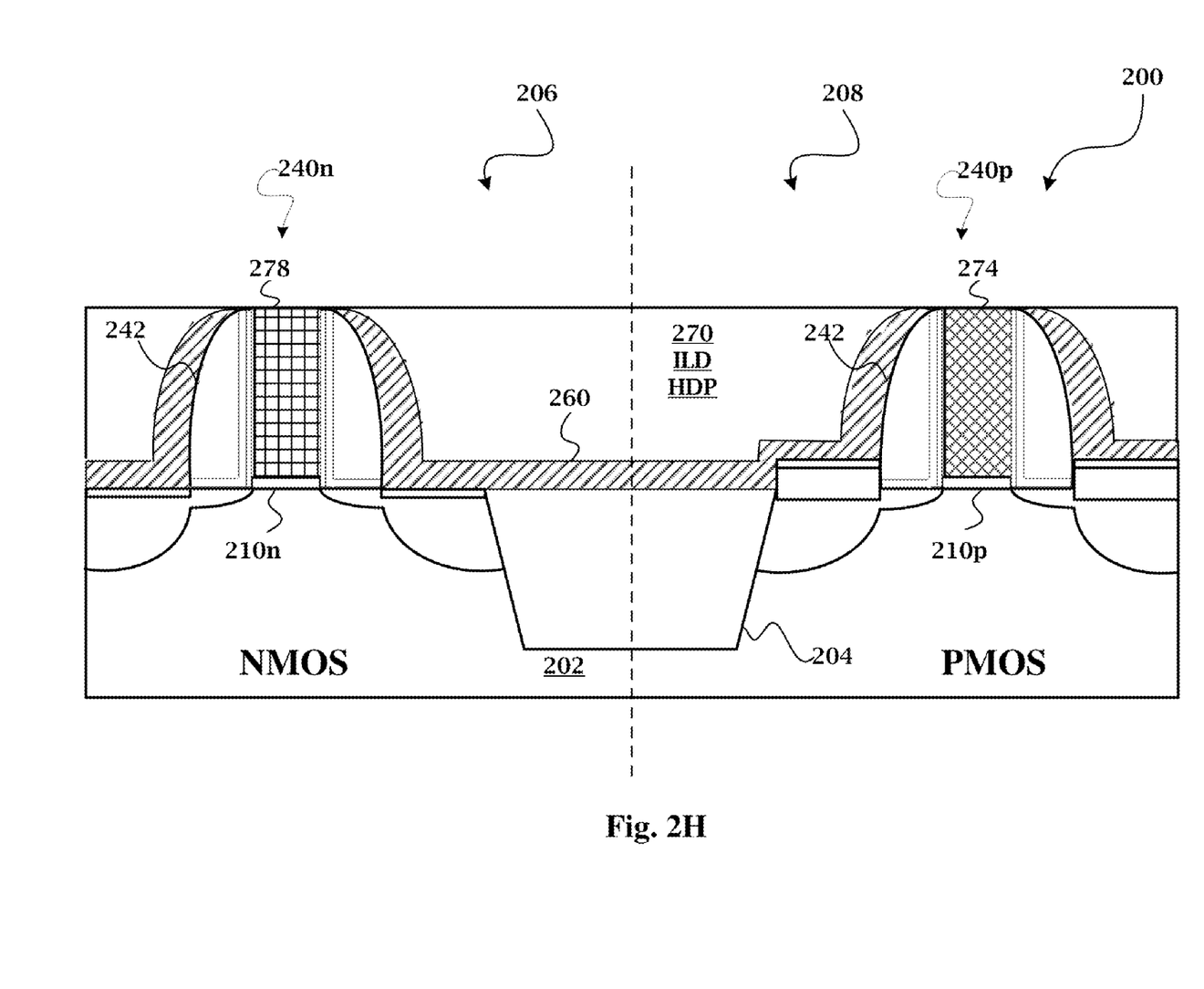

The method 100 continues with block 126 in which a second metal layer is formed to substantially fill the second trench. In FIG. 2H, a metal layer 278 is deposited to fill in the trench 272n. The metal layer 278 may include any metal material suitable for forming a metal gate or portion thereof, including work function layers, liner layers, interface layers, seed layers, adhesion layers, barrier layers, etc. The metal layer 278 may be formed by PVD, CVD, or other suitable processes. The metal layer 278 may include a N-type work function metal (N-metal) to provide a gate electrode that properly performs in the nMOS device 206. N-type metal materials may include compositions such as TiAl, TAlN, other aluminides, and/or other suitable materials. The metal layer 278 may further include a fill metal layer formed on the work function metal layer. The fill metal layer may include aluminum (Al) or tungsten (W), or other suitable materials. In an embodiment, the fill metal may include a Ti layer that functions as a wetting layer and an Al layer to fill in the remainder of the trench. The fill metal layer may be deposited using CVD, PVD, plating, or other suitable process. A CMP process may be performed to planarize the semiconductor device 200. The CMP process may remove the metal layer 278 outside of the trench 272n and provides the semiconductor device 200 with an N-metal gate structure. It should be noted that the N-metal may be formed first followed by the P-metal in some embodiments. Also, it is understood that during the formation of the metal gates for the nMOS device 206 and pMOS device 208, N/P patterning may be implemented to separate one type of device from the other, and vice versa.

In embodiments, the method 100 may continue to include additional process steps such as formation of contacts, interconnect structures (e.g., lines and vias, metal layers, and interlayer dielectric that provide electrical interconnection to the device including the formed metal gate), passivation layers, etc. For example, a multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure.

In summary, a gate last process may be implemented to form metal gate structures. Problems with forming the metal gate structures for an nMOS and pMOS device in a gate last process may be addressed by shaping the CESL layer to prevent void formation during ILD gap fill and leaving the hard mask layers to better control the gate height during the ILD CMP process. The methods disclosed herein can be easily integrated with a CMOS process flow and do not require additional complex steps to achieve the desired results. It is understood that embodiments disclosed herein offer different advantages, and that no particular advantage is necessarily required for all embodiments.

Accordingly, the present disclosure provides a device and method that includes a modified trench structure that prevents or reduces the risk of incomplete formation of a metal gate in a gate-last process. While the preceding description shows and describes one or more embodiments, it will be understood by those skilled in the art that various changes in form and detail may be made therein without departing from the spirit and scope of the present disclosure. For example, although the methods implements a "gate last" approach, the methods disclosed herein may be used in a hybrid process in which one type of metal gate is formed in a "gate first" process flow and the other type of metal gate is formed in a "gate last" process flow. Therefore, the claims should be interpreted in a broad manner, consistent with the present disclosure.

What is claimed is:

1. A method of fabricating a semiconductor device comprising:
   providing a semiconductor substrate having a first region and a second region;
   forming a high-k dielectric layer over the semiconductor substrate;
   forming a silicon layer over the high-k dielectric layer;
   forming a hard mask layer over the silicon layer;
   patterning the hard mask layer, the silicon layer, and the high-k dielectric layer to form a first gate structure over the first region and a second gate structure over the second region;
   forming a contact etch stop layer (CESL) over the first and second gate structures;
   modifying a profile of the CESL;
   forming an inter-layer dielectric (ILD) over the modified CESL;
   performing a chemical mechanical polishing (CMP) to expose the silicon layer of the first and second gate structures, respectively; and
   removing the silicon layer from the first and second gate structures, respectively, and replacing it with metal gate structures.

2. The method of claim 1, wherein forming the CESL includes forming the CESL such that a gap measured between a first portion of the CESL over the first gate structure and a second portion of the CESL over the second gate structure has a first dimension, and wherein modifying the profile of the CESL includes modifying the first and second portions of the CESL such that the gap increases from the first dimension to a second dimension.

3. The method of claim 2, wherein modifying the profile of the CESL includes dry etching the CESL.

4. The method of claim 2, wherein forming the ILD includes substantially filling in the gap with silicon oxide.

5. The method of claim 1, wherein the hard mask layer includes silicon oxide.

6. The method of claim 1, wherein the CMP process removes the hard mask layer from the first and second gate structures, respectively.

7. A method of fabricating a semiconductor device comprising:
   providing a semiconductor substrate having a first region and a second region;
   forming a first gate structure over the first region and a second gate structure over the second region, the first and second gate structures each including a high-k dielectric layer, a dummy poly gate, and a hard mask;
   forming a contact etch stop layer (CESL) over the first and second gate structures including the hard masks of the first and second gate structures, respectively;
   modifying a profile of the CESL, such that a gap measured between a first portion of the CESL, over the first gate structure and a second portion of the CESL over the second gate structure becomes larger;
   forming an interlayer dielectric (ILD) over the modified CESL substantially filling in the gap;
   performing a chemical mechanical polishing (CMP) on the ILD layer to remove the hard masks from the first and second gate structures, respectively, and expose the dummy poly gates of the first and second structures, respectively; and
   removing the dummy poly gates from the first and second gate structures, respectively, and replacing them with metal gate structures.

8. The method of claim 7, wherein the first and second gate structures each further includes sidewall spacers formed of silicon nitride.

9. The method of claim 8, wherein the CMP substantially stops at the silicon nitride of the sidewall spacers.

10. The method of claim 7, wherein modifying the profile of the CESL includes performing a dry etching process.

11. The method of claim 7, wherein modifying the profile of the CESL includes performing a high density plasma chemical vapor deposition (HPD-CVD) process.

12. A method of fabricating a semiconductor device comprising:
    providing a semiconductor substrate;
    forming one or more gate structures over the semiconductor substrate;
    forming an etch stop layer over the semiconductor substrate, including over the one or more gate structures;
    modifying a profile of the etch stop layer;
    forming a dielectric layer over the modified etch stop layer; and
    performing a chemical mechanical polishing process on the dielectric layer until a top portion of the one or more gate structures is reached.

13. The method of claim 12, wherein forming the etch stop layer includes forming a contact etch stop layer (CESL).

14. The method of claim 12, wherein modifying the profile of the etch stop layer includes increasing a gap measured between the etch stop layer of adjacent gate structures from a first dimension to a second dimension.

15. The method of claim 12, wherein modifying the profile of the etch stop layer includes performing a high density plasma chemical vapor deposition (HDP-CVD) process.

16. The method of claim 15, wherein performing the HDP-CVD process includes utilizing a high sputtering HDP-CVD process.

17. The method of claim 12, wherein forming a dielectric layer over the modified etch stop layer includes performing a HPD-CVD process.

18. The method of claim 17, wherein performing the HPD-CVD process includes utilizing a low sputtering HDP-CVD process.

19. The method of claim 12, further comprising:
    removing a dummy gate layer from the one or more gate structures;

replacing the removed dummy gate layer in a first set of the one or more gate structures with a first material having a first work function; and replacing the removed dummy gate layer in a second set of the one or more gate structures with a second material having a second work function.

20. The method of claim 12, wherein performing the chemical mechanical polishing process further includes removing a hard mask layer disposed over the one or more gate structures.

* * * * *